United States Patent [19]

Patel

[11] Patent Number: 4,703,485
[45] Date of Patent: Oct. 27, 1987

[54] METHOD AND APPARATUS FOR COMPUTING AND IMPLEMENTING ERROR DETECTION CHECK BYTES

[75] Inventor: Arvind M. Patel, San Jose, Calif.

[73] Assignee: International Business Machines Corporation, Armonk, N.Y.

[21] Appl. No.: 828,101

[22] Filed: Feb. 10, 1986

[51] Int. Cl.$^4$ ............................................. G06F 11/10
[52] U.S. Cl. ......................................................... 371/37
[58] Field of Search ........................ 371/37, 38, 39, 40

[56] References Cited

U.S. PATENT DOCUMENTS

| | | | |
|---|---|---|---|
| 4,447,902 | 5/1984 | Wilkinson | 371/39 |
| 4,504,948 | 3/1985 | Patel | 371/38 |
| 4,525,838 | 6/1985 | Patel | 371/37 |
| 4,559,568 | 12/1985 | Watanabe et al. | 371/39 X |
| 4,562,578 | 12/1985 | Odaka et al. | 371/40 |
| 4,630,272 | 12/1986 | Fukami et al. | 371/37 |

Primary Examiner—Charles E. Atkinson
Attorney, Agent, or Firm—F. David LaRiviere; Simon K. Lee

[57] ABSTRACT

Improved design, computation and implementation of pairs of error detection check bytes, where such bytes are appended to the end of a variable length record for data integrity check of the entire record after ECC correction, is provided. The error detection check bytes are each computed using different powers of the same companion T matrix of a degree-eight primitive polynomial used for computing associated ECC check bytes. Use of the same T matrix provides the computational convenience of a reasonable size Galois field of $GF(2^8)$, while providing long cycle length through a recurring offset within the data sequences corresponding to two members of each pair.

32 Claims, 3 Drawing Figures

METHOD AND APPARATUS FOR COMPUTING AND IMPLEMENTING ERROR DETECTION CHECK BYTES

CROSS-REFERENCE TO RELATED APPLICATION

The present invention is related to the invention described in the U.S. patent application entitled, "Method and Apparatus for Correcting Multibyte Errors Having Improved Two-Level Code Structure", Ser. No. 781,499, filed Sept. 27, 1985 by the inventor hereof, and is incorporated by reference as if fully set forth herein.

BACKGROUND OF THE INVENTION

The cyclic redundancy check (CRC) is extremely efficient and well suited for error detection in transmission, retrieval or storage of variable length records of binary data. CRC is capable of detecting nearly all patterns of error with almost negligent amount of redundancy.

CRC is also very well known. See, for example, "Cyclic Codes for Error Detection", W. W. Peterson and D. T. Brown, Proceedings of the IRE, pages 228 to 235, January, 1961, and "A Multi-channel CRC Register", Arvind M. Patel, Spring Joint Computer Conference, 1971.

A linear feedback register is essentially the only hardware needed for encoding and decoding variable length binary data for error detection by means of a CRC byte. The CRC byte is generated using a GF(2) polynomial divider circuit. In such a circuit, the binary information is serially shifted into a feedback shift register as the information is transmitted. The CRC byte is transmitted at the end of the binary data and received in sequence at the receiver. The generated CRC byte is then compared with the received CRC byte for detection of any errors in the received message which is processed in the same manner by a feedback shift register. The number of digits in the CRC byte determines the checking capability of the code and, in general, equals the number of stages of the encoding and decoding shift register.

SUMMARY OF THE INVENTION

This invention relates to improved design, computation and implementation of error detection check bytes, in particular CRC bytes, appended to the end of variable length records of binary data. These CRC bytes according to the present invention are created in pairs and each computed using different powers of a T matrix, the companion matrix of an irreducible polynomial, G(x), which is the same as that used for computing other associated ECC check bytes for the record. In many practical applications G(x) is a degree-eight primitive polynomial.

Use of the same T matrix provides computational convenience not found in conventional CRC implementations which typically employ a high degree (e.g. degree 16) polynomial divider to obtain long cycle length. The longer the cycle length, the less chance two errors in the same record will cancel; therefore, cycle length must be longer than the record. The present invention obtains long cycle lengths while operating in a reasonable size Galois field, such as $GF(2^8)$ instead of a larger field $GF(2^{16})$ in a conventional CRC.

The present invention is also useful in two-level error correction code configurations such as that used in the related invention referenced above. In that invention, the variable length record is divided into subblocks, each of which having $2 \times 2$ check bytes of the two-way interleaved cyclic codeword for single error correction, and $1 \times 2$ extension check bytes for double error detection. At the second level, correction of a double burst error in one subblock is provided by reprocessing the subblock check bytes with additional $1 \times 2$ extension check bytes at the end of the block. Four additional check bytes at the end of the block are CRC check bytes which provide substantially strong data integrity check after ECC correction and may be generated in accordance with the present invention.

When used in the two-level ECC scheme described above, use of the same T matrix provides computational convenience when second level error correction requires recomputation of CRC bytes.

DESCRIPTION OF THE PREFERRED EMBODIMENT

Figure 1:
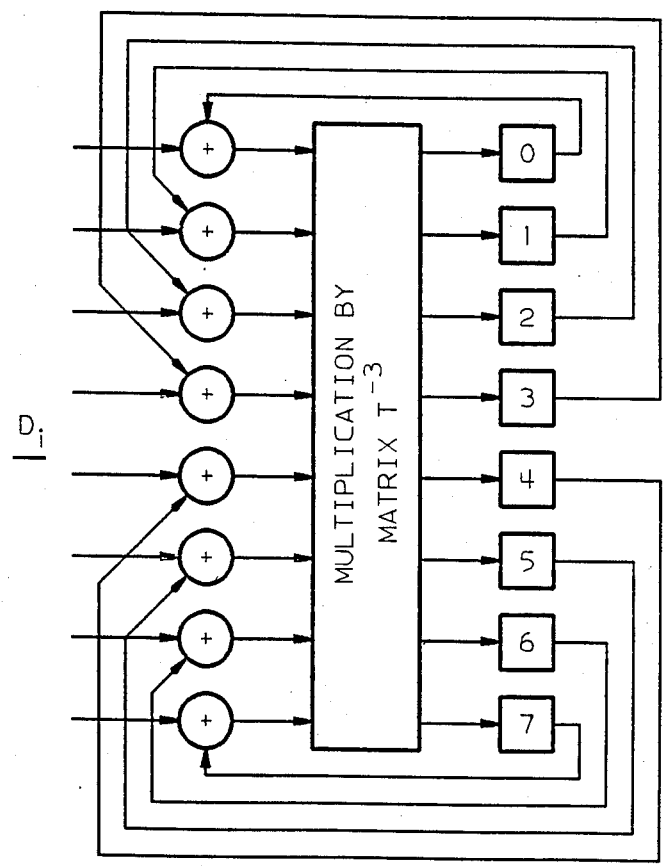
FIG. 1 is a block diagram of the logic for an encoding feedback shift register configured according to the principles of the present invention.

The four check bytes, CRC1, CRC2, CRC3, CRC4, are given by $$CRC1 = \sum_i T^{-i} D_i \qquad (1)$$

$$CRC2 = \sum_i T^{-2i} Z_i \qquad (2)$$

$$CRC3 = \sum_i T^{-3i} D_i \qquad (3)$$

$$CRC4 = \sum_i T^{-4i} Z_i \qquad (4)$$

The matrix T is a companion matrix of a degree-eight primitive polynomial, G(x). The polynomial is given by $$G(x) = g_0 \oplus g_1 x \oplus g_2 x^2 \oplus \ldots \oplus g_7 x^7 \oplus x^8, \qquad (5)$$

where $\oplus$ signifies modulo-2 sum.

Different powers of the same primitive element T are used to create all CRC as well as ECC functions. The matrix T of the polynomial G(x) is given by the following non-singular matrix $$T = \begin{pmatrix} 0 & 0 & 0 & 0 & 0 & 0 & 0 & g_0 \\ 1 & 0 & 0 & 0 & 0 & 0 & 0 & g_1 \\ 0 & 1 & 0 & 0 & 0 & 0 & 0 & g_2 \\ 0 & 0 & 1 & 0 & 0 & 0 & 0 & g_3 \\ 0 & 0 & 0 & 1 & 0 & 0 & 0 & g_4 \\ 0 & 0 & 0 & 0 & 1 & 0 & 0 & g_5 \\ 0 & 0 & 0 & 0 & 0 & 1 & 0 & g_6 \\ 0 & 0 & 0 & 0 & 0 & 0 & 1 & g_7 \end{pmatrix} \qquad (6)$$

Referring to Equations (1)–(4), the byte sequence [$D_i$] consists of all data bytes in a record and all first-level check bytes and excludes second-level check bytes. The byte sequence [$Z_i$] consists of the same bytes but further excludes two check bytes corresponding to the last two byte positions of each subblock (except the last subblock) to create a recurring, two-byte offset between sequences [$D_i$] and [$Z_i$]. The two bytes are excluded by inhibiting the clock signal which controls the shift register processing [$Z_i$] for two cycles.

The first-level check bytes in these sequences (and the corresponding error patterns) may be replaced by null bytes (i.e. all zeroes) in CRC calculatins. Such use of null bytes will eliminate the need for correcting errors, if any, in the ECC check bytes.

The sequence [$Z_i$] is offset from the sequence [$D_i$] by two bytes at the end of each subblock. When $G(x)$ is a degree-8 primitive polynomial, the exponent for matrices $T^{-1}$ and $T^{-2}$ is 255. If a typical subblock is 102 bytes long, the recurring offset arrangement of the present invention provides combined effective cycle lengths of two CRC checks for sequences [$D_i$] and [$Z_i$] as given below:

$255 \times 102 = 26{,}010$ bytes for [$D_i$], and $255 \times 100 = 25{,}500$ bytes for [$Z_i$].

Thus, two identical detectable error patterns will not cancel each other simultaneously in both types of CRC checks for any record comprising up to 255 subblocks of data.

All four check bytes, CRC1, CRC2, CRC3 and CRC4, are computed by means of four 8-bit shift registers with premultipliers $T^{-1}$, $T^{-2}$, $T^{-3}$ and $T^{-4}$, respectively. The sequence [$D_i$] is entered into shift registers 1 and 3 with premultipliers $T^{-1}$ and $T^{-3}$, respectively. Similarly, the sequence [$Z_i$] is entered into shift registers 2 and 4 with premultipliers $T^{-2}$ and $T^{-4}$, respectively. Note that subscript "i" counts from high to low and the last byte are identified by $D_1$ and $Z_1$ in their respective sequences.

By way of example for computing all CRC bytes according to the present invention, a typical encoder configuration for implementing Equation (3) is shown in FIG. 1. When the last bytes are entered, the contents of the four shift registers are shifted through 0, 1, 2 and 3 additional cycles, respectively, with null (all zeroes) input. The final contents of the shift registers comprise the four check bytes.

During the read process, CRC syndromes may be generated on-the-fly along with the ECC syndromes as the data are received. Of course, the CRC syndromes also must be adjusted for first- and second-level error correction. The equations for the four CRC cyndromes, $S_{-1}$, $S_{-2}$, $S_{-3}$ and $S_{-4}$ are given by $$S_{-1} = \hat{CRC1} \oplus \sum_i T^{-i}\hat{D}_i \oplus \sum_i T^{-i}E_1(D_i) \oplus \sum_i T^{-i}E_2(D_i) \qquad (7)$$

$$S_{-2} = \hat{CRC2} \oplus \sum_i T^{-2i}\hat{Z}_i \oplus \sum_i T^{-2i}E_1(Z_i) \oplus \sum_i T^{-2i}E_2(Z_i) \qquad (8)$$

$$S_{-3} = \hat{CRC3} \oplus \sum_i T^{-3i}\hat{D}_i \oplus \sum_i T^{-3i}E_1(D_i) \oplus \sum_i T^{-3i}E_2(D_i) \qquad (9)$$

$$S_{-4} = \hat{CRC4} \oplus \sum_i T^{-4i}\hat{Z}_i \oplus \sum_i T^{-4i}E_1(Z_i) \oplus \sum_i T^{-4i}E_2(Z_i) \qquad (10)$$

The symbol ^ indicates readback bytes, $E_1(D_i)$ and $E_1(Z_i)$ represent the first-level-error-correction patterns and $E_2(D_i)$ and $E_2(Z_i)$ represent the second-level-error-correction patterns corresponding to the recorded bytes $D_i$ and $Z_i$, respectively. The error patterns corresponding to the check bytes are replaced by null bytes.

The data sequence [$\hat{D}_i$] and the corresponding sequence of error-correction patterns [$E_1(D_i)$] appear at the input and output of the first-level decoder, respectively. If second-level error correction is required, then the error patterns [$E_2(Z_i)$] will be available for decoding at the second level.

If the first-level decoder includes a subblock buffer and on-the-fly error correction, then first-level CRC syndromes can be computed from the corrected data which is the combined sequence [$D_i \oplus E_1(D_i)$]. However, if the first-level error correction is deferred, then the subblock buffer and corrected data sequence may not be readily available. In that case, the CRC syndromes may be computed by combining partial computations. Syndrome $S_{-3}$ is used to illustrate the process which is applicable to all CRC syndromes. The partial computations of Equation (9) are defined as $$S_{-3}(0) = \hat{CRC3} \oplus \sum_i T^{-3i}\hat{D}_i \qquad (11)$$

$$S_{-3}(1) = S_{-3}(0) \oplus \sum_i T^{-3i}E_1(D_i) \qquad (12)$$

$$S_{-3}(2) = S_{-3}(1) \oplus \sum_i T^{-3i}E_2(D_i) \qquad (13)$$

where $S_{-3}(0)$, $S_{-3}(1)$ and $S_{-3}(2)$ denote the values for $S_{-3}$ with no error correction, first-level error correction and second-level error correction, respectively. Corresponding equations for partial computations of Equations (7), (8) and (10) are given in Appendix A to this specification.

Equations (11) and (12) can be implemented using two shift registers (each similar to the one shown in FIG. 1) for processing the uncorrected sequence [$\hat{D}_i$] and the first-level-error-pattern sequence [$E_1(D_i)$] separately. Each shift register will use the multiplier $T^{-3}$. The first shift register provides a sufficient CRC check if no errors were corrected. This check is available immediately at the end of the record. When first-level error correction is required, the second shift register provides the CRC check with one-subblock delay from the end of record.

Preferably, however, the two sequences [$\hat{D}_i$] and [$E_1(D_i)$] can be processed in one shift register. Note that the one-subblock delay between these two sequences creates a delay of exactly 102 byte positions between them. If a count-down clock j, synchronized to the output of the first-level decoder, is used, then $E(D_j)$ appears at the output in synchronism with $\hat{D}_{j-102}$ at the input. We can combine Equations (11) and (12) and rewrite in terms of j as $$S_{-3}(1) = CRC3 \oplus \sum_{j=1}^{L+102} T^{-3j}[T^{3 \times 102}\hat{D}_{j-102} \oplus E_1(D_j)] \qquad (14)$$

where L is the length of sequence [$D_j$]. Note that $E_1(D_j)$ for $j > L$ and $D_{j-102}$ for $j \leq 102$ do not exist, (are null bytes).

Figure 2:
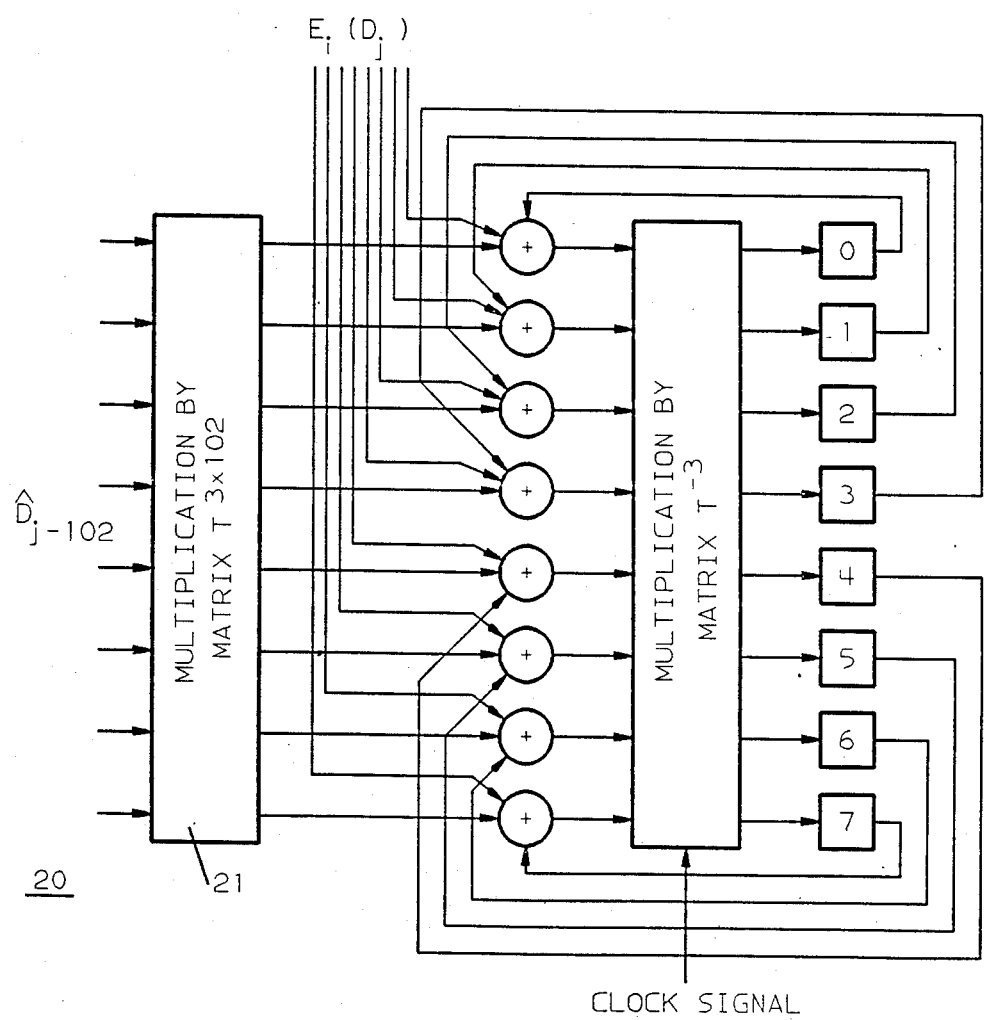
FIG. 2 is a block diagram of the logic for a feedback shift register for simultaneous decoding of data and error patterns configured according to the principles of the present invention.

Equation (14) may be implemented with a shift register shown in FIG. 2 in which the sequence [$\hat{D}_j$] enters through a premultiplier $T^{3 \times 102}$ and added to the sequence [$E_1(D_j)$] at the input as the clock parameter j counts down from L+102 to 1. The sequence $[\hat{D}_j]$ starts at j=L+102 and ends at j=103. The sequence $E_1(D_j)$ starts at j=L and continues after j=102 to the end j=1. The final content of the shift register, when combined with $\hat{CRC}3$, yields $S_{-3}(1)$.

Figure 3:
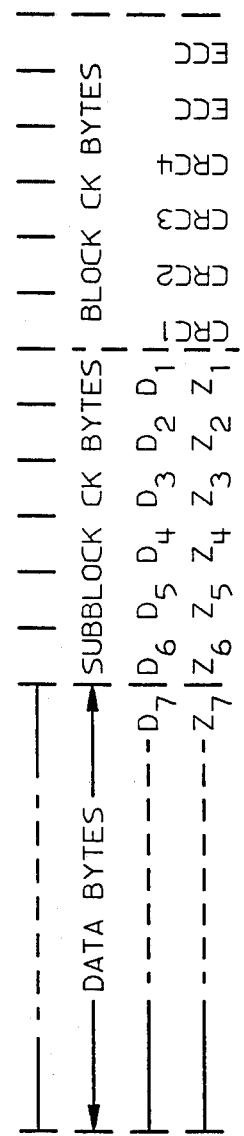
FIG. 3 is a diagrammatic illustration showing the format of data bytes and subblock and block check bytes at the end of a two-level encoded record configured for a disk memory track constructed according to the principles of the present invention.

Referring to FIG. 3, all four readback CRC bytes at the end of the record also may be processed through a corresponding shift register along with the data during the readback process. Just as null bytes are entered for subblock check bytes during encoding, null bytes are also entered for the CRC positions at the end of the record. Similarly, null bytes are entered again for syndrome generation during the readback process. For example, byte CRC3 is physically offset two byte positions away from the last byte, $D_1$, of sequence $[D_i]$ as shown in FIG. 3. Thus, two additional null bytes are entered into the shift register for CRC3 after byte $D_1$ during encoding as well as syndrome generation.

Readback byte $\hat{CRC}3$ is processed through premultiplier 21 in shift register 20 after byte $D_1$ and two null bytes. At the end of entering sequence $[E_1(D_i)]$ two null bytes need not be entered. The final contents of shift register 20 therefore is syndrome $S_{-3}(1)$. The contents of shift register 20 upon entering the last readback byte $\hat{CRC}3$ provides sufficient CRC check if no errors were corrected. In particular the content at j=102 is 0, if and only if, syndrome $S_{-2}(1)$ is 0. Thus, if all ECC syndromes are 0, the immediate contents of the CRC registers at the end of the record provide a complete CRC check without requiring the final 100 shifting operations. Since most data records are error-free, this feature of the present invention provides substantialy performance advantage.

The other CRC syndromes are computed in like manner. Syndrome $S_{-1}$, given by Equation (7), merely requires different multiplier circuits, namely, $T^{-1}$ and $T^{102}$ in place of those shown in FIG. 2. Syndromes $S_{-2}$ and $S_{-4}$ require processing of sequences $[\hat{Z}_i]$ and $[E_1(Z_i)]$, in which one subblock delay equals 100 byte positions between them. Thus, the corresponding multiplier circuits for $S_{-2}$ are $T^{-2}$ and $T^{2 \times 100}$, and for $S_{-4}$ are $T^{-4}$ and $T^{4 \times 100}$.

As in CRC3, any CRC byte may be processed along with the data through its shift register by allowing appropriate number of cycles with null byte input during encoding or syndrome-generation operations. In particular, CRC1, CRC2, CRC3 and CRC4 require 0, 1, 2 and 3 additional cycles, respectively, with null byte input at the end of their sequences $[D_i]$ and $[\hat{D}_i]$ or $[Z_i]$ and $[\hat{Z}_i]$.

If no errors are present, all CRC syndromes will be 0. If second-level error correction is required, one of the subblocks with up to four byte-error corrections will be involved. Byte count "i" in sequence $[D_i]$ for each of the four error bytes will be determined from the error location numbers generated by the second-lvel ECC decoders of the referenced invention. Thereafter, for Equation (13), the term "$T^{-3i}E_2(D_i)$" for each i can be computed using the same log and antilog tables as those used by the ECC decoder employing the relation $$T^{-3i}E_2(D_1) = \log^{-1}\{[\log E_2(D_i) - 3i] \text{modulo } 255\}. \quad (15)$$

When added to the previously computed $S_{-3}(1)$, the final CRC check of Equation (9) corresponding to the CRC syndrome $S_{-3}$ is now complete.

Similarly, the byte count i in sequence $[Z_i]$ for each of the four errors will also be determined. Computations for syndromes $S_{-1}$, $S_{-2}$, $S_{-3}$ and $S_{-4}$ will be done in like manner. These final values of CRC syndromes must be all zero if all errors are corrected properly and no errors are present.

Errors in CRC bytes will tend to create unnecessary reread operations with undue performance penalty. In order to avoid such performance penalty, operational rules which balance adequate error correction and detection capability against unnecessary reread operations may be adopted.

Rule 1: All CRC bytes may be ignored if subblock level and block level ECC syndromes are zero.

Rule 2: One non-zero CRC check on $[D_i]$ sequence and one such CRC check on $[Z_i]$ sequence may be ignored if second-level correction is not required.

Rule 3: Block level ECC check may be ignored if all CRC checks are zero and second-level correction is not required.

Rule 2 allows errors in up to two CRC bytes, one each in sequences $[D_i]$ and $[Z_i]$, thereby retaining the benefit of the offset between such sequences. In order to balance the errors in the odd and even phases, odd phase CRCs, namely CRC1 and CRC3 are generated from the $[D_i]$ sequence and the even phase CRCs, namely CRC2 and CRC4 are generated from the $[Z_i]$ sequence.

According to the present invention, four separate CRC check bytes derived from the primitive field element in $GF(2^8)$ provide not only computational convenience but also a better check. The recurring offset of the sequences $[D_i]$ and $[Z_i]$ provide desired long cycle length without using degree-16 polynomials.

APPENDIX A

For Equation (7), $$S_{-1}(0) = \hat{CRC}1 \oplus \sum_i T^{-i}\hat{D}_i \quad (7A)$$

$$S_{-1}(1) = S_{-1}(0) \oplus \sum_i T^{-i}E_1(D_i) \quad (7B)$$

$$S_{-1}(2) = S_{-1}(1) \oplus \sum_i T^{-i}E_2(D_i); \quad (7C)$$

For Equation (8), $$S_{-2}(0) = \hat{CRC}2 \oplus \sum_i T^{-2i}\hat{Z}_i \quad (8A)$$

$$S_{-2}(1) = S_{-2}(0) \oplus \sum_i T^{-2i}E_1(Z_i) \quad (8B)$$

$$S_{-2}(2) = S_{-2}(1) \oplus \sum_i T^{-2i}E_2(Z_i) \quad (8C)$$

For Equation (10), $$S_{-4}(0) = \hat{CRC}4 + \sum_i T^{-4i}\hat{Z}_i \quad (10A)$$

$$S_{-4}(1) = S_{-4}(0) \oplus \sum_i T^{-4i}E_1(Z_i) \quad (10B)$$

$$S_{-4}(2) = S_{-4}(1) \oplus \sum_i T^{-4i}E_2(Z_i) \quad (10C)$$

I claim:

1. Apparatus for generating a plurality of CRC check bytes for a variable-length record having error correction check bytes and correction capability, said apparatus comprising:

(a) first means for sequentially receiving all data bytes in the record including all error correction check bytes inserted into the record at preselected intervals having $m_1$ bytes therein and for multiplying the received contents, as such contents are received by a matrix of the form $T^{-n}$, where $-n$ is an integer and different from any integer used for computing the error correction check bytes, to produce a first designated preselected number of CRC check bytes;

(b) second means for sequentially receiving all data bytes in the record including all error correction check bytes corresponding to the sequence received by the first means but excluding said error correction check bytes corresponding to a preselected number of check byte positions from the end of each interval except the last interval and for multiplying the last mentioned received contents, as such contents are received by a matrix of the form $T^{-(n+1)}$ to produce a second designated preselected number of CRC check bytes; and (c) means for combining the outputs of the first and second means, in a preselected sequence into said plurality of CRC check bytes.

2. Apparatus as in claim 1 further comprising means for inhibiting the sequential operation of said second means for the preselected number of said check byte positions to thereby exclude said preselected number of error correction check bytes.

3. Apparatus as in claim 2 wherein the error correction byte positions have null bytes therein.

4. Apparatus as in claim 3 wherein the preselected number of error correction byte positions excluded is two.

5. Apparatus as in claim 1 wherein the first and second designated preselected number of CRC check bytes produced are equal.

6. Apparatus as in claim 5 wherein the first and second designated preselected number of CRC check bytes produced are each two.

7. A method for computing a plurality of CRC check bytes for a variable-length record having error correction check bytes and correction capability, said method comprising the steps of:

(a) sequentially receiving all data bytes in the record including all error correction check bytes inserted into the record at preselected intervals having $m_1$ bytes therein;

(b) sequentially multiplying the data bytes in step (a) by a matrix in the form $T^{-n}$, where $-n$ is an integer and different from any integer used for computing the ECC check bytes, to produce a first designated preselected number of CRC check bytes;

(c) sequentially receiving all data bytes in the record including all error correction check bytes corresponding to the sequence received in step (a) but excluding said check bytes corresponding to a preselected number of said check byte positions from the end of each interval except the last interval;

(d) sequentially multiplying the data bytes in step (c) by a matrix of the form $T^{-(n+1)}$ to produce a second designated preselected number of CRC check bytes; and (e) appending the first and second designated CRC check bytes in a preselected sequence to the end of the record.

8. The method as in claim 7 wherein the step of (c) includes the step of inhibiting the sequential receiving of said check bytes for the preselected number of said check byte positions to thereby exclude said preselected number of check bytes.

9. The method as in claim 8 wherein the error correction byte positions have null bytes therein.

10. The method as in claim 9 wherein the preselected number of error correction byte positions excluded is two.

11. The method as in claim 7 wherein the first and second designated preselected number of CRC check bytes produced are equal.

12. The method as in claim 11 wherein the first and second designated preselected number of CRC check bytes produced are each two.

13. Apparatus for simultaneously processing readback data bytes and error correction bytes for a variable length record having error correction check bytes and multi-level correction capability, said apparatus comprising:

(a) first syndrome computing means receiving said record for computing the value of a first type of CRC syndrome $S_{-n(1)}$ adjusted for error correction by a matrix of the form $T^{-n}$ in accordance with the relation $$S_{-n}(1) = CRCn \oplus \sum_i T^{-ni}D_i \oplus \sum_i T^{-ni}E_1(D_i),$$

where $-n$ is any integer, i is the byte count in sequence $(D_i)$, and $E_1(D_i)$ is the sequence of one level of error correction bytes corresponding to the sequence, $D_i$, of all data bytes in the record including all error correction check bytes inserted into the record at preselected intervals having $m_1$ bytes therein;

(b) second syndrome computing means receiving said record for computing the value of a second type of CRC syndrome $S_{-(n+1)}(1)$ adjusted for error correction by a matrix of the form $T^{-(n+1)}$ in accordance with the relation $$S_{-(n+1)}(1) = C\hat{R}C(n+1) \oplus \sum_i T^{-(n+1)i}\hat{Z}_i \oplus \sum_i T^{-(n+1)i}E_1(Z_i),$$

where i is the byte count in sequence $(Z_i)$, and $E_1(Z_i)$ is the sequence of one level of error correction bytes corresponding to the sequence, $Z_i$, of all data bytes in the record including all error correction check bytes corresponding to the sequence $D_i$ but excluding said check bytes corresponding to a preselected number of check byte positions from the end of each interval except the last interval; and (c) processing means receiving said first type of CRC syndrome and said second type of CRC syndrome for processing error correction.

14. Apparatus as in claim 13 where said processing means further includes second-level processing means for processing second-level error correction bytes for a variable length record having first- and second-level error correction check bytes and correction capability, said second-level processing means comprising:

(a) first partial processing means receiving said record for computing a partial value of the CRC syndrome adjusted for second-level error correction in accordance with the relation $$T^{-ni}E_2(D_i) = \log^{-1}\{[\log E_2(D_i) - ni] \text{modulo} 255\}$$

where i is the byte count in sequence ($D_i$), and $E_2(D_i)$ is the sequence of second-level error correction bytes corresponding to the sequence, $D_i$, of all data bytes in the record including all first-level error correction check bytes and excluding second-level error correction check bytes;

(b) first combining means for combining the partial value computed by the first partial processing means with the value of the CRC syndrome computed by the first syndrome computing means to produce a total value of the CRC syndrome adjusted for second-level error correction therefor;

(c) second partial processing means receiving said record for computing a partial value of the CRC syndrome for second level error correction in accordance with the relation $$T^{-(n+1)i}E_2(Z_i) = \log^{-1}\{[\log E_2(Z_i) - (n+1)i] \mathrm{modulo} 255\},$$

where i is the byte count in sequence ($Z_i$), and $E_2(Z_i)$ is the sequence of second-level error correction bytes corresponding to the sequence, $Z_i$, of all data bytes in the record including all first-level error correction check bytes and excluding all second-level error correction check bytes and check bytes corresponding to the last two byte positions of each sub-block except the last sub-block; and (d) second combining means for combining the partial value computed by the second partial processing means with the value of the CRC syndrome computed by the second syndrome computing means to produce a total value of the CRC syndrome adjusted for second-level error correction therefor.

15. Apparatus as in claim 13 wherein the preselected number of said check byte positions from the end of each interval is two.

16. Apparatus as in claim 14 wherein the first and second partial processing means are not activated if the values of $E_2(D_i)$ and $E_2(Z_i)$ are zero.

17. Apparatus according to claim 14 further comprising means of inhibiting the processing of all CRC bytes when first- and second-level error correction syndromes are zero.

18. Apparatus as in claim 17 further including means for inhibiting the processing of one non-zero CRC check in ($D_i$) sequence and one non-zero check in ($Z_i$) sequence when second-level error correction is not required.

19. Apparatus as in claim 18 further including means for inhibiting block level error correction check when all CRC syndromes are zero and second-level correction is not required.

20. A method for simultaneously processing readback CRC check bytes and error correction bytes for a variable length record having error correction check bytes and correction capability, said method comprising the steps of:

(a) computing the value of the CRC syndrome adjusted for error correction in accordance with the relation $$S_{-n}(1) = \mathrm{C\hat{R}C} n \oplus \sum_i T^{-ni}\hat{D}_i \oplus \sum_i T^{-ni}E_1(D_i),$$

where $-n$ is any integer, i is the byte count in sequence [$D_i$], and $E_1(D_i)$ is the sequence of error correction bytes corresponding to the sequence, $D_i$, of all data bytes in the record including all error correction check bytes inserted into the record at preselected intervals having $m_1$ bytes therein; and (b) computing the value of the CRC syndrome adjusted for error correction in accordance with the relation $$S_{-(n+1)}(1) = \mathrm{C\hat{R}C}(n+1) \oplus \sum_i T^{-(n+1)i}\hat{Z}_i \oplus \sum_i T^{-(n+1)i}E_1(Z_i),$$

where n is any integer, i is the byte count in sequence [$Z_i$], and $E_1(Z_i)$ is the sequence of error correction bytes corresponding to the sequence, $Z_i$, of all data bytes in the record including all error correction check bytes corresponding to the sequence $D_i$ but excluding said check bytes corresponding to a preselected number of check bytes positions from the end of each interval except the last interval.

21. The method as in claim 20 further including the step of processing second-level error correction bytes for a variable length record having first- and second-level error correction check bytes and correction capability, said further included step comprising the steps of:

(c) computing a partial value of the CRC syndrome adjusted for second-level error correction in accordance with the relation $$T^{-ni}E_2(D_i) = \log^{-1}\{[\log E_2(D_i) - ni]\mathrm{modulo} 255\}$$

i is the byte count in sequence [$D_i$], and $E_2(D_i)$ is the sequence of second-level error correction bytes corresponding to the sequence, $D_i$, of all data bytes in the record including all first-level error correction check bytes and excluding second-level error correction check bytes;

(d) combining the partial value computed in step (c) with the value of the CRC syndrome computed in step (a) to produce a total value of the CRC syndrome adjusted for second-level error correction therefor;

(e) computing a partial value of the CRC syndrome for second-level error correction in accordance with the relation $$T^{-(n+1)i}E_2(Z_i) = \log^{-1}\{[\log E_2(Z_i) - (n+1)i]\mathrm{modulo} 255\},$$

i is the byte count in sequence [$Z_i$], and $E_2(Z_i)$ is the sequence of second-level error correction bytes corresponding to the sequence, $Z_i$, of all data bytes in the record including all first-level error correction check bytes and excluding all second-level error correction check bytes and check bytes corresponding to the last two byte positions of each subblock except the last subblock; and (f) combining the partial value computed in step (e) with the value of the CRC syndrome computed in step (b) to produce a total value of the CRC syndrome adjusted for second-level error correction therefor.

22. The method as in claim 21 wherein the preselected number of said check byte positions from the end of each interval is two.

23. The method as in claim 22 wherein steps (c) and (e) are not performed if the values of $E_2(D_i)$ and $E_2(Z_i)$ are zero.

24. A method according to claim 18 comprising the step of ignoring all CRC bytes when said first- and second-level error correction syndromes are zero.

25. The method as in claim 24 further including the step of ignoring the presence of one non-zero CRC check in $[D_i]$ sequence and one non-zero check in $[Z_i]$ sequence when second-level error correction is not required.

26. The method as in claim 25 further including the step of ignoring block level error correction check when all CRC syndromes are zero and second-level correction is not required.

27. Apparatus for simultaneously processing readback data bytes, including error correction check bytes, and error correction bytes, said apparatus comprising:
first processing means for receiving all readback data bytes in the record including all error correction check bytes inserted into the record at preselected intervals having $m_1$ bytes therein, and for multiplying said last-mentioned readback data bytes by a matrix of the form $T^{nm}1$, where n is an odd integer and different from any integer used for computing error correction check bytes;
second processing means coupled to the first processing means for sequentially receiving processed readback data bytes therefrom;
third processing means coupled to the second processing means for multiplying the contents of the second processing means, as such contents are received thereby, by the matrix of the form $T^{-n}$;
said third processing means also multiplying error correction bytes which are delayed by a time duration corresponding to $m_1$ bytes, as such error correction bytes are received thereby, by the matrix of the form $T^{-n}$ to produce a first designated preselected number of CRC syndromes;
fourth processing means for receiving all readback data bytes in the record including all error correction check bytes corresponding to the sequence received by the first processing means but excluding said check bytes corresponding to a preselected number of said check byte positions from the end of each interval (hereinafter referred to as $m_2$ bytes) except the last interval, and for multiplying said last-mentioned readback data bytes by a matrix of the form $T^{(n+1)m}2$;
fifth processing means coupled to the fourth processing means for sequentially receiving processed readback data bytes therefrom; and
sixth processing means coupled to the fifth processing means for multiplying the contents of the fifth processing means, as such contents are received thereby, by the matrix of the form $T^{-(n+1)}$;
said sixth processing means also multiplying error correction bytes which are delayed by a time duration corresponding to $m_2$ bytes, as such error correction bytes are received thereby, by the matrix of the form $T^{-(n+1)}$ to produce a second designated number of CRC syndromes.

28. Apparatus as in claim 27 for processing first and second readback CRC check bytes wherein:
the first processing means receives a first CRC check byte inserted at the end of the record, and multiplies said first CRC check byte by a matrix of the form $T^{nm}1$;
the second processing means sequentially receives the processed CRC check byte from the first processing means;
the third processing means multiplies the contents of the second processing means, as such contents are received thereby, by the matrix of the form $T^{-n}$;
the fourth processing means receives a second CRC check byte and multiplies said second CRC check byte by a matrix of the form $T^{(n+1)m}2$;
the fifth processing means sequentially receives processed CRC check byte from the fourth processing the means; and
the sixth processing means multiplies the contents of the fifth processing means, as such contents are received thereby, by the matrix of the form $T^{-(n+1)}$.

29. Apparatus as in claim 28 further including means for processing third and fourth readback CRC check bytes corresponding to the first and second readback CRC bytes, respectively, wherein said further included means comprise:
first further processing means for receiving the third CRC check byte and for multiplying said last-mentioned third CRC check byte by a matrix of the form $T^{nm}1$;
second further processing means coupled to the first further processing means for sequentially receiving the processed CRC check byte therefrom;
third further processing means coupled to the second further processing means for multiplying the contents of the second processing means, as such contents are received thereby, by the matrix of the form $T^{-n}$;
fourth further processing means for receiving the fourth CRC check byte and for multiplying said fourth CRC check byte by a matrix of the form $T^{(n+1)m}2$;
fifth further processing means coupled to the fourth further processing means for sequentially receiving the processed CRC check byte therefrom; and
sixth further processing means coupled to the fifth further processing means for multiplying the contents of the fifth processing means, as such contents are received thereby, by the matrix of the form $T^{-(n+1)}$.

30. A method for simultaneously processing readback data bytes, including error correction check bytes, and error correction bytes, said method comprising the steps of:
(a) receiving all readback data bytes in the record including all error correction check bytes inserted into the record at preselected intervals having $m_1$ bytes therein, and multiplying said last-mentioned readback data bytes by a matrix of the form $T^{nm}1$, where n is a integer and different from any integer used for computing error correction check bytes;
(b) sequentially receiving processed readback data bytes produced in step (a);
(c) multiplying the readback data bytes received in step (b), as such bytes are received, by the matrix of the form $T^{-n}$;
(d) multiplying error correction bytes which are delayed by a time duration corresponding to $m_1$ bytes, as such error correction bytes are received, by the matrix of the form $T^{-n}$ to produce a first designated preselected number of CRC syndromes;
(e) receiving all readback data bytes in the record including all error correction check bytes corresponding to the sequence received in step (a) but excluding said check bytes corresponding to a preselected number of said check byte positions from the end of each interval (hereinafter referred to as $m_2$ bytes) except the last interval, and multiplying said last-mentioned readback data bytes by a matrix of the form $T^{(n+1)m_2}$;

(f) sequentially receiving processed readback data bytes produced in step (e);

(g) multiplying the readback data bytes received in step (f), as such bytes are received, by the matrix of the form $T^{-(n+1)}$;

(h) multiplying error correction bytes which are delayed by a time duration corresponding to $m_2$ bytes, as such error correction bytes are received, by the matrix of the form $T^{-(n+1)}$ to produce a second designated number of CRC syndromes.

31. The method as in claim 30 for processing first and second readback CRC check bytes further including the steps of:

(i) receiving the first CRC check byte inserted at the end of the record, and multiplying said first CRC check byte by a matrix of the form $T^{nm_1}$;

(j) sequentially receiving the processed CRC check byte produced in step (i);

(k) multiplying the sequentially received byte in step (j), as such byte is received, by the matrix of the form $T^{-n}$;

(l) receiving the second CRC check byte and multiplying said second CRC check byte by a matrix of the form $T^{(n+1)m_2}$;

(m) sequentially receiving the processed CRC check bytes produced in step (1); and (n) multiplying the sequentially received byte in step (m), as such byte is received, by the matrix of the form $T^{-(n+1)}$.

32. The method as in claim 31 further including the step of processing third and fourth readback CRC check bytes corresponding to the first and second readback CRC bytes, respectively, wherein said further included step comprises the steps of:

(o) receiving the third CRC check byte and multiplying said last-mentioned third CRC check byte by a matrix of the form $T^{nm_1}$;

(p) sequentially receiving said processed CRC check byte produced in step (o);

(q) multiplying the sequentially received byte in step (o), as such byte is received, by the matrix of the form $T^{-n}$;

(r) receiving the fourth CRC check byte and multiplying said fourth CRC check byte by a matrix of the form $T^{(n+1)m_2}$;

(s) sequentially receiving said processed CRC check byte produced in step (r); and (t) multiplying the sequentially received byte in step (s), as such byte is received, by the matrix of the form $T^{-(n+1)}$.

* * * * *

UNITED STATES PATENT AND TRADEMARK OFFICE
CERTIFICATE OF CORRECTION

PATENT NO. : 4,703,485
DATED : October 27, 1987
INVENTOR(S) : Arvind M. Patel

It is certified that error appears in the above-identified patent and that said Letters Patent is hereby corrected as shown below:

IN THE CLAIMS:

Column 8, line 14, delete the word "simultaneously".

Column 9, line 54, delete the word "simultaneously".

Column 11, line 13, delete the word "simultaneously".

Column 12, line 43, delete the word "simultaneously".

Signed and Sealed this

Twenty-third Day of August, 1988

Attest:

DONALD J. QUIGG

*Attesting Officer*　　　　*Commissioner of Patents and Trademarks*